United States Patent [19]

Klocek

[11] Patent Number: 5,611,866
[45] Date of Patent: Mar. 18, 1997

[54] METHOD OF REMOVING $B_2O_3$ ENCAPSULANT FROM A STRUCTURE

[75] Inventor: Paul Klocek, Garland, Tex.

[73] Assignee: Texas Instruments Incorporated, Dallas, Tex.

[21] Appl. No.: 472,601

[22] Filed: Jun. 7, 1995

Related U.S. Application Data

[62] Division of Ser. No. 748,602, Aug. 22, 1991, abandoned.

[51] Int. Cl.$^6$ .................................. B08B 3/04; B08B 5/04
[52] U.S. Cl. .................................. 134/5; 134/19; 134/21; 134/26
[58] Field of Search .................................. 134/5, 19, 21, 134/26

[56] References Cited

U.S. PATENT DOCUMENTS 4,589,898  5/1986  Beaver ........................................ 65/12
4,773,852  9/1988  Tanji et al. ................................ 432/263

*Primary Examiner*—Zeinab El-Arini
*Attorney, Agent, or Firm*—René E. Grossman; Richard L. Donaldson; Jay M. Cantor

[57] ABSTRACT

A method of removing $B_2O_3$ encapsulant from a structure which includes providing a structure having a melting temperature and having a layer of $B_2O_3$ thereon. This structure with the layer of $B_2O_3$ thereon is placed in a chamber at a temperature in excess of 400° C. and below the melting temperature of the structure and at some pressure and the pressure in the chamber is decreased, preferably to about −14.7 psig, until the $B_2O_3$ foams. Then the temperature in the chamber is lowered to below 400° C. and preferably to about ambient temperature external of the chamber. The structure with the $B_2O_3$ thereon is washed in an alcohol, preferably one of methanol and isopropanol, after the $B_2O_3$ has foamed and the structure is then washed with the $B_2O_3$ thereon after the $B_2O_3$ has foamed in a liquid non-reactive with the structure to remove the $B_2O_3$ from the structure, preferably water.

10 Claims, 2 Drawing Sheets

5,611,866

METHOD OF REMOVING B₂O₃ ENCAPSULANT FROM A STRUCTURE

This is a divisional of application Ser. No. 07/748,602 filed Aug. 22, 1991 now abandoned.

BACKGROUND OF THE INVENTION

FIELD OF THE INVENTION

This invention relates to a crystal growth process for producing large area group III-V compounds and particularly GaAs having controllable resistivity and the use thereof for fabrication of infrared window/domes with EMI/EMP protection.

BACKGROUND AND BRIEF DESCRIPTION OF THE PRIOR ART

All electro-optical (EO) systems can be easily affected by electro-magnetic interference (EMI) and electro-magnetic pulses (EMP). The source of such interference can be of various types, including radio frequencies (RF), microwaves, magnetic fields, nuclear pulses, etc. emanating external of the electro-optical system. Such interference can adversely affect the operation of the EO system or, at times, destroy the system and particularly, its sensor. Since all EO systems usually have a window or dome separating them from the external environment, it is desirable and even often required that the window or dome provide EMI/EMP protection.

In the prior art such protection has generally been obtained by application of a conductive coating or grid, such as a metal window screen, to the window or dome. This conductive coating or grid couples with any EMI/EMP, thereby reflecting and, to a much lesser extent, absorbing this radiation. Thus, the EO system is shielded. There are, however, serious drawbacks to the use of conductive coatings and grids of windows and domes. These include transmission losses in the infrared region (the usual operational wavelengths of the EO system), modulation transfer function (MTF) or resolution losses due to diffraction effects and limited EMI/EMP protection of less than 30 dB at 1 GHz. It is generally essential that a substantial portion of the desired frequency spectrum be transmitted through the dome or window.

Gallium arsenide (GaAs) and gallium phosphide (GAP) are currently the only materials known that are optically transparent in the 1 to 14 micrometer (micron) wavelength region while their resistivity and temperature can vary over a wide range. However, other group III-V and group II-VI compounds should also have this property.

Ge is very temperature sensitive and the resistivity is too high to offer the same EMI protection as would GaAs. Silicon (Si) has been suggested for use as an infrared window as set forth in U.S. Pat. No. 4,826,266, however silicon is infrared transmissive only in the 3 to 5 micron range and not in the 8 to 12 micron range. The discussion hereinafter will be directed to GaAs, it being understood that GaP is also included as an appropriate material in accordance with the invention and that other group III-V and group II-VI compounds could possibly also be used. GaAs is, however, very expensive and difficult to fabricate with large dimensions on the order of the dimensions of optical system windows and domes. Furthermore, the uniform doping required to control and adjust the resistivity of GaAs has been very difficult if not impossible to achieve in the prior art.

In the prior art, there are two processes which have been generally used to produce optical quality GaAs, these being liquid encapsulated Czochralski (LEC) and Bridgman. The LEC method is limited in the size wafer it can produce. Bridgman techniques, on the other hand, have been used to produce large (8 inch×12 inch) GaAs windows but with non-uniform doping and at great expense.

The LEC method involves loading gallium into a crucible, usually made of boron nitride. Boron oxide glass is placed on top of the gallium. Arsenic is loaded into an injector cell, which is usually a hollow fused quartz vessel with a tube extending therefrom. The crucible containing the gallium and boron oxide glass and the arsenic-containing injector are placed within a heated pressure vessel and the crucible is heated above the melting point of GaAs. The boron oxide glass softens and flows over the gallium to encapsulate it. This glass encapsulant and the pressure in the vessel prevent liquid GaAs from decomposing. The arsenic injector is then positioned and heated so that the arsenic sublimes into the gallium forming GaAs liquid (some systems mix the gallium and arsenic in the crucible and compound them under higher pressures, thereby doing away with the injector). The injector is removed from the crucible and a seed crystal is dipped into the top of the liquid GaAs. The seed is then pulled upward such that a GaAs crystal grows therefrom. The LEC process requires several operations as well as manpower and is therefore expensive. Large size crystals cannot be grown due to the seed pulling operation and the required dimensions and temperature uniformity of the heater.

Bridgman growth involves the translation of the melt (liquid GaAs) through a temperature gradient that causes crystal growth. The furnace, melt or temperature gradient can be translated in any direction to accomplish the growth. To utilize the Bridgman process, the gallium and arsenic are loaded into opposite ends of a fused quartz ampoule which is then sealed. The gallium is heated above the melting point of GaAs and the arsenic is heated to a temperature such that it sublimes and reacts with the gallium, forming GaAs. The temperature gradient is then translated across the melt which freezes or grows the GaAs crystal. The sizes that can be produced in a Bridgman system are limited by the availability of a functional ampoule. The labor and material (the ampoule) also make the Bridgman process expensive. Since the normal growth direction is horizontal, this produces non-uniformities in the GaAs doping and therefore non-uniformities in the resistivity across the GaAs crystal. This is due to the natural segregation of the dopant during growth.

It is known that standard undoped, high resistivity semiconductor grade GaAs is highly transmissive to infrared frequencies in the range of 1 to 14 microns and is opaque from about 14 to 30 or 40 microns but then again becomes transparent. It is also known that the above described GaAs is opaque from about 1 micron downward to about the x-ray range, though the question of opacity below the 1 micron range is not of concern herein. However, such material is not useful as an EMI protective optical window or dome unless it can be made opaque to the entire spectrum above 14 microns. It is therefore apparent that an optical window or dome which is capable of transmitting the desired infrared frequencies (3 to 5 and 8 to 12 microns) with no or minimal loss, yet is opaque to frequencies below the useful infrared frequency range, is highly desirable. It is further apparent that a crystal growth process for producing optical grade group III-V compounds and particularly GaAs or GaP that overcomes the above noted limitations is also desirable.

SUMMARY OF THE INVENTION

In accordance with the present invention, there is provided a window and/or dome which eliminates all of the drawbacks of the conductive coatings and grids of the prior art and provides much greater EMI/EMP protection as well as concomitant high transmissivity in the 1 to 14 micron range.

It is first noted that germanium (Ge) is capable of providing the desired transmissivity in the infrared range and opaqueness outside of the infrared range. However, Ge cannot be used at high speeds because it becomes opaque at all frequencies under conditions of high speed. Since the use of the optical windows of interest herein generally involves operation at high speeds, Ge must be rejected as a useful material for the purposes discussed herein.

Group III-V compounds and particularly gallium arsenide (GaAs) and gallium phosphide (GAP), if properly fabricated (i.e, grown and doped), as will be discussed hereinbelow, have been found to be excellent EO window and dome candidate materials for infrared transparency. Both materials can be doped with a shallow donor in an amount from about $5 \times 10^{15}$ atoms/cc to about $2 \times 10^{16}$ atoms/cc with a preferred amount of $8 \times 10^{15}$ atoms/cc to render the materials conductive to resistivities up to about 0.1 ohm-cm. The desired resistivity of the novel materials herein is from about 0.07 to about 10 ohm-cm with a preferred resistivity of about 0.1 ohm-cm and an electron mobility of greater than about 3000 $cm^2$/volt-second and preferably about 5000 $cm^2$/volt-second. If the amount of carbon in the melt is greater than $1 \times 10^7$ atoms/cc, then an increased amount of Se must be used, such as about $5 \times 10^{16}$ atoms/cc with inferior results. The preferred shallow donor is selenium (Se), though tellurium (Te) and sulfur (S) can also be used with inferior results (less uniformity) since Se, which segregates less during growth, fits into the lattice structure of GaAs and GaP better than do Te or S.

A shallow donor is one wherein the amount of energy required to ionize or remove an electron from the outer band is extremely low, the energy at room temperature being more than sufficient to pull the electron off, creating a conduction electron. The conduction electrons have high mobility and result in free-carrier absorption in the material. The high mobility of the conductive electrons creates a large dependence of the free-carrier absorption on wavelength whereby, at longer wavelengths, the material becomes very highly absorbing with effectively no absorption at lower wavelengths (i.e., the infrared or 1 to 14 micron range).

Another reason for selecting shallow donors is that they are fully ionized at room temperature. At room temperature, the donors will have contributed all of their electrons to the conduction band. Therefore, if the temperature of the material changes, there is little change in the physical properties thereof. This conductivity can be controlled so that the GaAs and GaP remain infrared transparent while offering substantial EMI/EMP protection and being opaque to frequencies outside the infrared frequency range of interest (i.e., 1 to 14 microns). This protection is due to the coupling of the EMI/EMP to the free carriers in the GaAs or GaP. This coupling causes reflection, and to a much greater extent, absorption of the EMI/EMP. Specifically, n-type GaAs with a resistivity of about 0.1 ohm-cm and high electron mobility greater than 5000 $cm^2$/volt-second has been fabricated by doping with selenium, though tellurium (Te) and sulfur (S) can also be used, resulting in a material with measured optical and EMI/EMP properties as follows:

n-Type GaAs EMI/EMP Window/Dome Properties

| Optical Absorption Coefficients ($cm^{-1}$) | Attenuation @ 15 GHz (dB) |
|---|---|
| <0.02 | >60 |

This highly transparent and EMI/EMP protective GaAs has no MTF losses. Similar properties are achieved in GaP. These materials provide the solution to the problem of infrared windows and domes with inadequate EMI/EMP protection for EO systems.

In order to overcome the limitation of the LEC and Bridgman processes as discussed above, GaAs of optical quality with a uniform and controllable resistivity and with large dimension (e.g., 12 inches by 12 inches) is produced. The process uses graphite as opposed to quartz crucibles having a soft, compliant carbon cloth containing essentially no adverse contaminants and covering the bottom portion thereof, preferably graphite, with a preferred thickness of about 20 mils. Gallium, shallow donor selenium (Se) in a preferred amount of $8 \times 10^{15}$ atoms/cc and boron oxide ($B_2O_3$) glass are loaded into the crucible. The boron oxide has a water content of about 450 to 550 parts per million and preferably 500 parts per million which assists in removal of impurities from the GaAs melt, particularly carbon to about $1 \times 10^{15}$ atoms/cc or less with the total impurity content of 1 part per million or less (Without the wet boron oxide, the impurities would not be removed, thereby requiring an increase in the Se doping level, thereby lowering the mobility of the electrons and increased non-uniformity and providing an inferior result). Arsenic is loaded from an injector made of fused quartz into the crucible to provide a stoichiometric melt of GaAs with a small amount of Se therein in the amount of $5 \times 10^{15}$ atoms/cc to $5 \times 10^{16}$ atoms/cc and preferably $8 \times 10^{15}$ atoms/cc. A multi-zone furnace with the number of zones to be used depending upon the size of the crystal to be grown, is used to control the melt and crystal growth. Once the arsenic has been sublimed into the gallium, forming liquid GaAs encapsulated by the boron oxide glass under pressure of from about 20 to about 30 psig in an inert atmosphere, preferably argon, in the vessel, the crystal is frozen or grown from the bottom up. The growth is achieved by imposing a cold spot on the bottom center of the graphite crucible which has a tapered bottom and tapered sides and contains the melt. This causes nucleation of the melt at the bottom center. A uniform thermal gradient across the furnace and perpendicular to the crucible vertical axis is then imposed on the melt. This causes the GaAs crystal to grow in a vertical direction, but with a planar interface. It is this planar growth interface that maintains uniform doping across the crystal and therefore a uniform resistivity. When the entire crystal has been formed, the inert gas is vented out of the chamber and the gas in the chamber is then pumped out to provide a vacuum therein to a level wherein the $B_2O_3$ reboils due to the gases entrapped therein. This vacuum can vary over a great range based upon the temperature of the $B_2O_3$ and the amount of gas therein. This reboiling causes the $B_2O_3$ to foam on the surface of the crystal wherein the $B_2O_3$ loses strength and is then cooled to a solid while foamed and removed by placing in alcohol and then dissolving in water. This minimizes the likelihood of cracking of the crystal. The crystal is then removed from the crucible and detaches therefrom readily due to the presence of the carbon cloth as a layer between the crystal and the crucible.

It should be understood that the above described process can be performed without the dopant to provide large area gallium arsenide with controllable high resistivity for purposes of optical domes, windows and components for use at infrared frequencies other than EMI protection and for fabrication of semiconductor electronic components and such process is also contemplated in accordance with the present invention. The stability of the growth process also results in the lowest reported values (0.3 cm$^{-1}$) of absorption at 1.06 microns in GaAs, allowing use of 1.06 micron EO systems with this window.

This process is also contemplated for other infrared transmitting material, such as Si, Ge and group II-VI and group III-V compounds for purposes of EMI protection, windows, domes and components.

This process takes less than half the time and materials of the LEC or Bridgman processes and is therefore significantly less expensive.

The invention herein provides, among other features, a novel infrared window and/or dome that provides EMI/EMP protection, infrared transmitting and GaAs and GaP that strongly attenuate RF and microwave radiation and application of conductive infrared transmitting materials for windows and domes with EMI/EMP protection as well as a novel process for making large area GaAs with controllable and uniform resistivity.

DESCRIPTION OF THE PREFERRED EMBODIMENT

Figure 1:
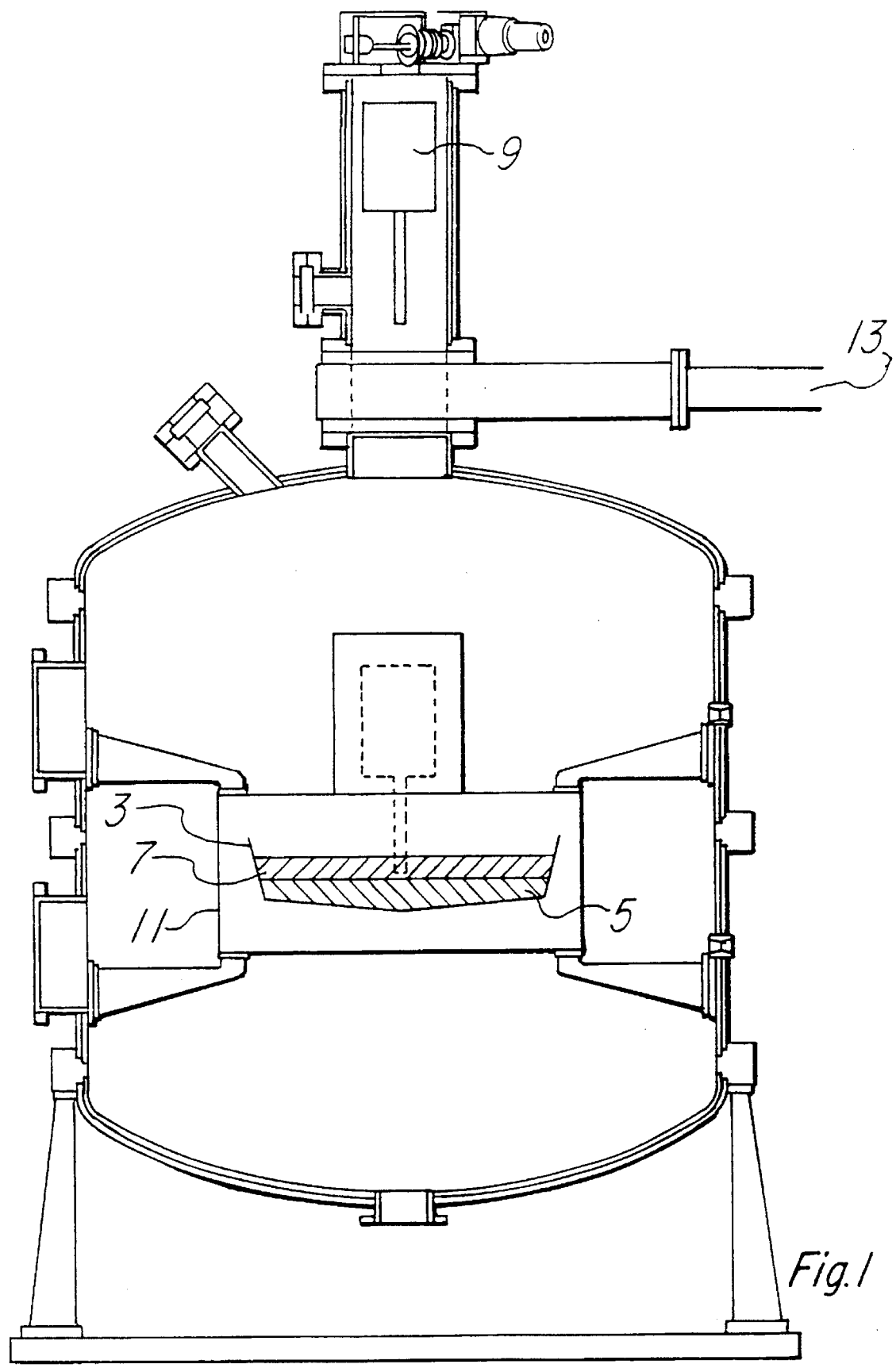
FIG. 1 shows a vertical gradient growth apparatus for using in forming gallium arsenide in accordance with the present invention.

Referring now to FIG. 1, in order to overcome the limitations of the LEC and Bridgman processes as discussed above, GaAs of optical quality with a uniform and controllable resistivity and with large dimension (e.g., 12 inches by 12 inches) is produced. The process uses a pressure chamber 1 having therein a graphite boat or crucible 3 with tapered sides and bottom into which gallium 5, shallow donor selenium (Se) in an amount of 8×10$^{15}$ atoms/cc (not shown) and boron oxide (B$_2$O$_3$) glass encapsulant 7 are loaded. Arsenic which has been loaded into an injector 9 made of fused quartz is lowered to the injection position to inject the arsenic into the crucible 3 after opening of the isolation valve 13 to provide a stoichiometric melt of GaAs with the small amount of Se therein in an argon atmosphere at a pressure of 20 to 30 psig.

The chamber 1 is maintained at the pressure of 20 to 30 psig of argon. The furnace 11 and therefore the Ga 5 is heated to a uniform temperature above the melting point of GaAs (1238° C.). In order for the As injection to proceed to completion, the Ga 5 is held from 1° to 15° C. above 1238° C. Too hot or too cold Ga will result in loss of As due to the As vapor pressure overcoming the pressure on the encapsulant 7 or the As exceeding the solubility limit if the Ga is below 1238° C. Stoichiometry is obtained by maintaining the required exact amounts of Ga and As with a small 0.5% or less excess of As to allow for residuals As in the injector 9 and small losses from the melt. The control of the exact amount of As to less than 0.5% excess As than needed for stoichiometry is one of the key controls of very low absorption at 1.06 microns.

Figure 2:
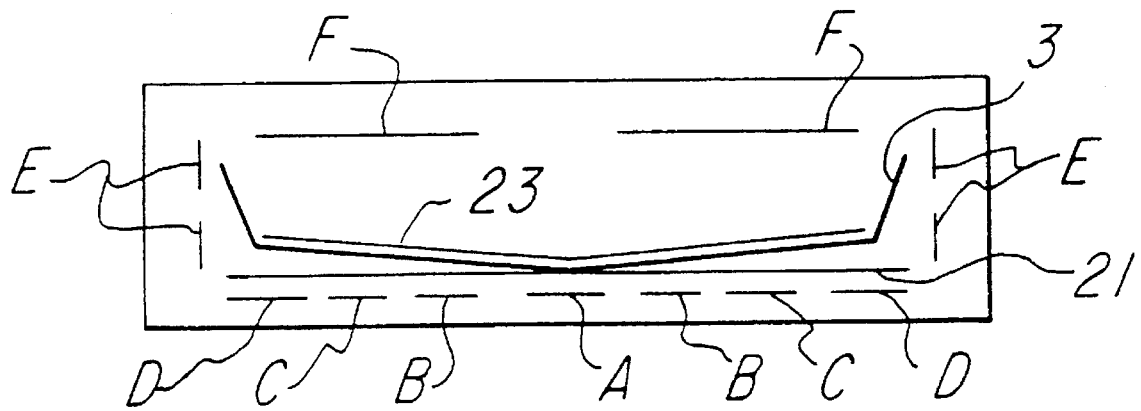
FIG. 2 is a side view of heating elements surrounding the crucible in accordance with the present invention.
Figure 3:
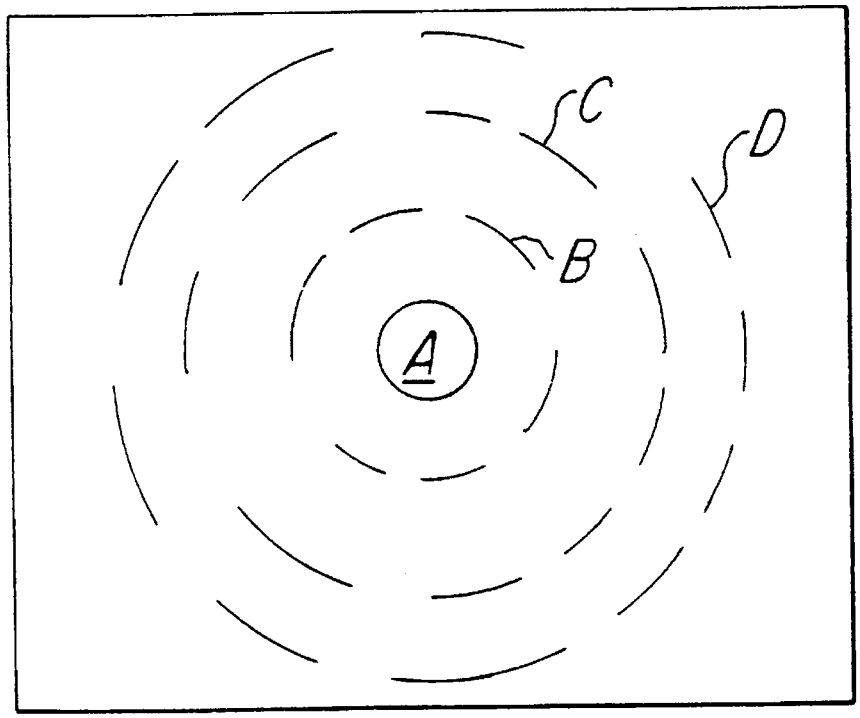
FIG. 3 is a top view of the heating elements in accordance with the present invention.

A multi-zone furnace 11 is used to control the melt and crystal growth. A typical furnace for use in conjunction with the present invention is shown in FIGS. 2 and 3 wherein the graphite boat 3 is shown supported on a boat support 21. A carbon cloth 23, preferably of graphite having a thickness of 20 mils rests over the entire bottom of the boat 3. The boat 3 is surrounded by heating elements of the furnace 11 (FIG. 1) which include, as shown in FIGS. 2 and 3, a single element A beneath the center of the boat, four heating elements B in a circle spaced outwardly from element A, eight elements C in a circle spaced outwardly from elements B, four elements D in a circle spaced outwardly from elements C, sixteen side elements E in two levels spaced in a circle about the boat and two top elements F disposed over the boat.

Once the arsenic has been sublimed into the gallium, forming liquid GaAs encapsulated by the boron oxide glass encapsulant 7 under pressure of 20 to 30 psig in the vessel 3, the GaAs crystal is then frozen or grown from the bottom up.

The growth proceeds with the bottom center zone of the furnace 11 lowering its temperature below the melting point of GaAs, 1238° C. This causes the GaAs melt in the boat 3 to nucleate and begin to grow from the bottom center in a primarily outward direction to the walls of the boat 3 and then primarily in an upward direction under control of the various sections of the furnace 11 as discussed hereinbelow. The boat 3 is tapered on the bottom and sides to aid in beginning the crystal growth at the bottom center and, ultimately, the release of the final crystal from the boat. The temperature of the other bottom zones, designed in a radially symmetric pattern, are lowered below 1238° C., creating a radially symmetric thermal gradient as generally follows with reference to FIGS. 2 and 3:

| Time after As Injection | 1 hr. | 2 hrs. | 3 hrs. | 4 hrs. | 6 hrs. | 9 hrs. |
| --- | --- | --- | --- | --- | --- | --- |
| A | 1230° C. | 1225° C. | 1220° C. | 1215° C. | 1200° C. | 1200° C. |
| B | 1232° C. | 1227° C. | 1222° C. | 1217° C. | 1200° C. | 1200° C. |
| C | 1236° C. | 1235° C. | 1225° C. | 1220° C. | 1205° C. | 1200° C. |
| D | 1236° C. | 1235° C. | 1225° C. | 1220° C. | 1205° C. | 1200° C. |
| Sides | 1245° C. | 1245° C. | 1245° C. | 1240° C. | 1230° C. | 1200° C. |
| Top | 1245° C. | 1245° C. | 1245° C. | 1245° C. | 1240° C. | 1200° C. |

This results in the growth of the crystal from the center up and the center out to the edges. Then the side zone temperatures are lowered at point 4 hours while the top zones are held at 1245° C. This allows a planar vertical interface to advance up through the melt, growing a large flat plate of GaAs. Eventually the temperatures of the side and top zones are lowered to allow completion of the crystal growth. The very small thermal gradients within the growing crystal (less than 20° C.) result in the stoichiometric, low defect, low dislocation GaAs, with a uniform distribution of dopant through the thickness of the crystal. The doping is uniform across the thickness, which is essential for use as a window or dome.

The crystal is annealed at 850° C., by lowering all furnace zones to this temperature at a rate of about 2° C./minute and is held at this temperature for 8 to 12 hours. As the temperatures in the zones are then lowered at about 2° C./minute after annealing in the range of 550° to 520° C. and preferably to 530° C., the pressure is vented from the chamber and evacuated with pumps to about −14.7 psig. This causes the $B_2O_3$ glass encapsulant 7 to reboil (dissolved gas bubbles out), resulting in a foaming glass which becomes solid as the furnace lowers in temperature below 400° C. This foamed $B_2O_3$ is too brittle to fracture the crystal as the temperature is lowered to room temperature (about 20° to 25° C.). Once cooled, the crucible 3 with the GaAs crystal and the foamed $B_2O_3$ thereover are placed in alcohol (preferably methanol, ethanol, propanol or isopropanol) and then the $B_2O_3$ is completely dissolved in water, releasing the GaAs crystal from the crucible. The GaAs crystal can now be fabricated into a window.

It should be understood that the above described process can be performed without the dopant to provide large area gallium arsenide with controllable resistivity for purposes including and other than EMI protection with optical domes and window for use at infrared frequencies and such process is also contemplated in accordance with the present invention.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. A method of removing $B_2O_3$ encapsulant from a structure comprising the steps of:

(a) providing a structure having a melting temperature above 400° C. and having a layer of $B_2O_3$ thereon;

(b) placing said structure with said layer of $B_2O_3$ thereon in a chamber at a temperature in excess of 400° C. and below said melting temperature of said structure and at a pressure above the foaming temperature of said $B_2O_3$;

(c) decreasing said pressure in said chamber until said $B_2O_3$ foams;

(d) then lowering the temperature in said chamber to below 400° C.;

(e) washing said structure with said $B_2O_3$ thereon in an alcohol after said $B_2O_3$ has foamed; and (f) then washing said structure with said $B_2O_3$ thereon after said $B_2O_3$ has foamed in a liquid non-reactive with said structure to remove said $B_2O_3$ from said structure.

2. The method of claim 1 wherein said pressure is lowered to about −14.7 psig.

3. The method of claim 1 wherein said temperature is lowered to about ambient temperature external of said chamber.

4. The method of claim 3 wherein said alcohol is one of methanol and isopropanol.

5. The method of claim 2 wherein said temperature is lowered to about ambient temperature external of said chamber.

6. The method of claim 5 wherein said alcohol is one of methanol and isopropanol.

7. The method of claim 6 wherein said liquid is water.

8. The method of claim 1 wherein said alcohol is one of methanol and isopropanol.

9. The method of claim 2 wherein said alcohol is one of methanol and isopropanol.

10. The method of claim 1 wherein said liquid is water.

* * * * *